(12) United States Patent
Renaud et al.

(10) Patent No.: US 8,022,505 B2
(45) Date of Patent: Sep. 20, 2011

(54) SEMICONDUCTOR DEVICE STRUCTURE AND INTEGRATED CIRCUIT THEREFOR

(75) Inventors: Philippe Renaud, Cugneaux (FR); Patrice Besse, Toulouse (FR); Amaury Gendron, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 318 days.

(21) Appl. No.: 12/282,486

(22) PCT Filed: Mar. 13, 2006

(86) PCT No.: PCT/EP2006/004032
§ 371 (c)(1),
(2), (4) Date: Sep. 10, 2008

(87) PCT Pub. No.: WO2007/104342
PCT Pub. Date: Sep. 20, 2007

(65) Prior Publication Data
US 2009/0057833 A1    Mar. 5, 2009

(51) Int. Cl.
*H01L 27/082* (2006.01)
*H01L 23/62* (2006.01)
*H01L 29/76* (2006.01)
*H01L 31/062* (2006.01)
*H01L 29/94* (2006.01)

(52) U.S. Cl. ......... 257/577; 257/355; 257/360; 257/367

(58) Field of Classification Search .................. 257/577, 257/133, 360, 362, 363, 358, 173, 355–357, 257/141, 590, 492, 491, 327, 493, 335, 336, 257/339, 343
See application file for complete search history.

(56) References Cited

U.S. PATENT DOCUMENTS

| | | | |
|---|---|---|---|
| 5,521,783 A | 5/1996 | Wolfe et al. | |
| 6,696,731 B2 | 2/2004 | Mallikarjunaswamy | |
| 6,707,110 B2 | 3/2004 | DeHeyn et al. | |
| 6,784,029 B1 | 8/2004 | Vashchenko et al. | |
| 2002/0030231 A1* | 3/2002 | Okawa et al. | 257/355 |
| 2003/0006464 A1 | 1/2003 | DeHeyn et al. | |
| 2004/0016992 A1* | 1/2004 | Mallikarjunaswamy | 257/546 |

OTHER PUBLICATIONS

Concannon; "Test structures and test methodology for developing high voltage ESD protection"; IEEE, 2003.

* cited by examiner

*Primary Examiner* — Chuong A. Luu

(57) ABSTRACT

A semiconductor device structure comprises a plurality of vertical layers and a plurality of conductive elements wherein the vertical layers and plurality of conductive elements co-operate to function as at least two active devices in parallel. The semiconductor device structure may also comprise a plurality of horizontal conductive elements wherein the structure is arranged to support at least two concurrent current flows, such that a first current flow is across the plurality of vertical conductive elements and a second current flow is across the plurality of horizontal conductive elements.

20 Claims, 4 Drawing Sheets

FIG. 5
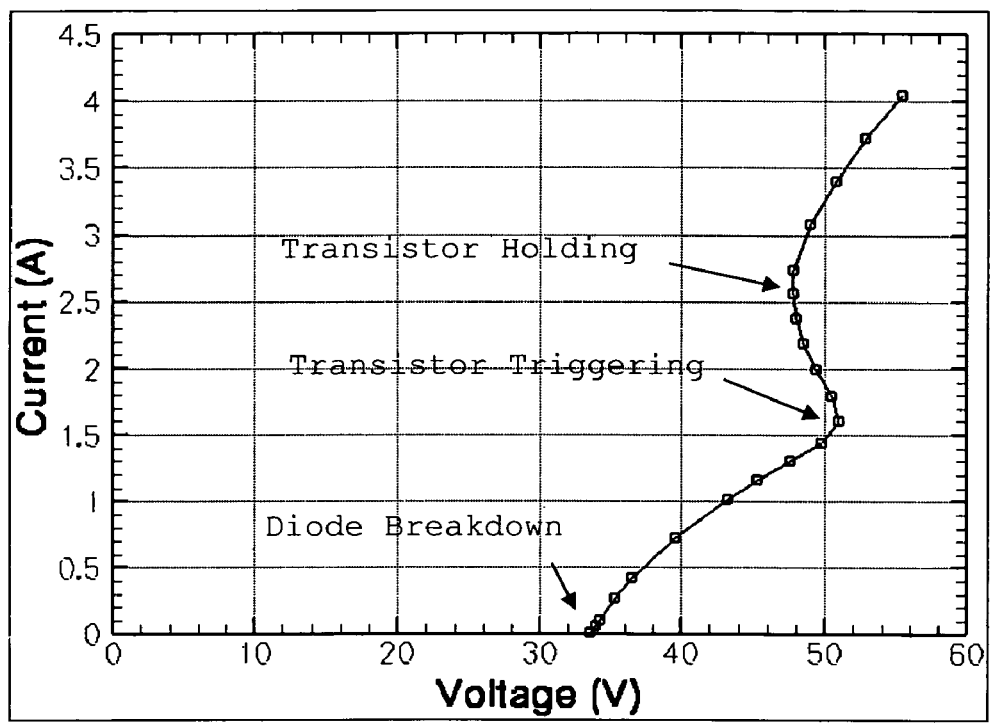
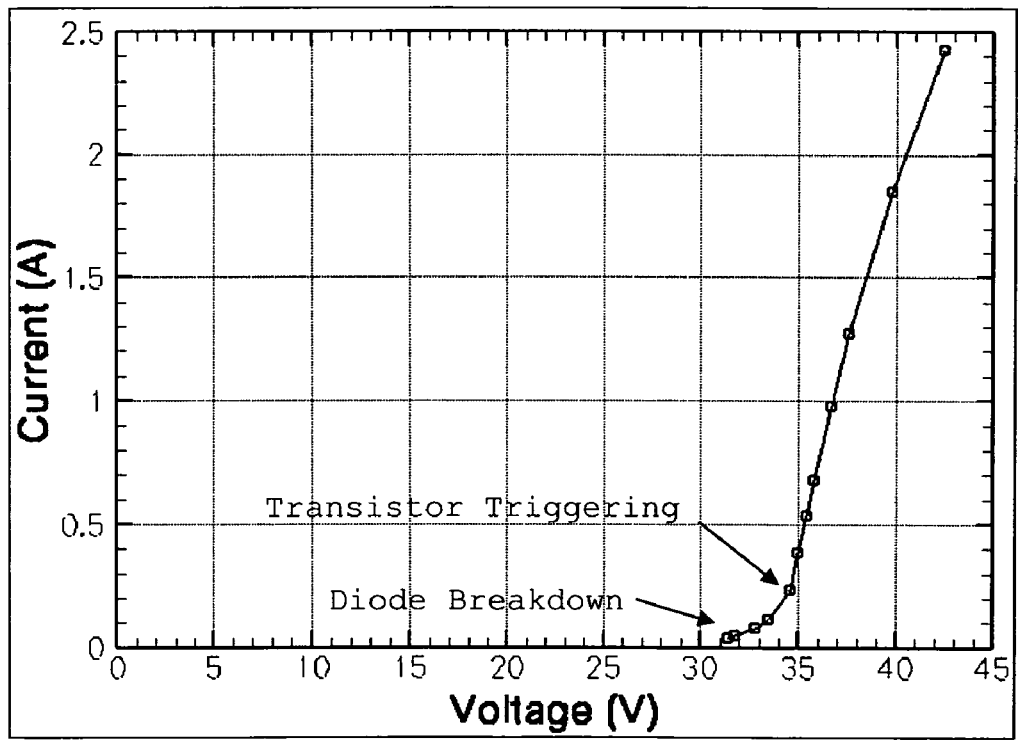

SEMICONDUCTOR DEVICE STRUCTURE AND INTEGRATED CIRCUIT THEREFOR

FIELD OF THE INVENTION

One embodiment of the present invention relates to a semiconductor device structure. The invention is applicable to, but not limited to, a semiconductor device structure that protects against electro-static discharge in power applications.

BACKGROUND OF THE INVENTION

It is known that semiconductor power devices can be formed from a wide range of technologies. For example, one technology suitable for power devices is metal oxide semiconductor field effect transistors (MOSFET). Such MOSFETs can be constructed with a negative (N-channel) structure or a positive (P-channel) structure, as known to those skilled in the art. For an N-channel MOSFET device a positive control voltage will cause the MOSFET device to turn on, whereas for a P-channel MOSFET device a negative control voltage will cause the MOSFET device to turn on.

As is well known to a person skilled in the art, the source and drain of a MOSFET device are formed in a semiconductor material, such as silicon, whilst the gate is formed from a conductive material, such as polycrystalline silicon. The gate is separated from the semiconductor material by an insulating layer, for example silicon dioxide ($SiO_2$). A MOSFET device is susceptible to damage when a 'breakdown' voltage is applied to the MOSFET.

It is known that two types of voltage damage can occur to a MOSFET device, namely:
  (i) Electro Static Discharge (ESD); and
  (ii) Electrical Over Stress (EOS).

In the case of EOS there are three possible failure modes. First, a breakdown voltage of the gate oxide may be reached; second, a breakdown voltage of the drain to source (BVDSS) junction may be reached; and third, a maximum junction temperature may be reached due to high temperature generated by energy discharges.

In the case of ESD there are two possible failure modes. First, the breakdown voltage of the parasitic drain-body-source bipolar transistor may be reached; and second, a breakdown voltage of the gate oxide may be reached. It is known that in the case of bipolar devices, an ESD event may cause irreversible damage, for example due to a structure junction and/or a contact overheating.

A common solution used to avoid over-voltage problems is termed a 'snapback' structure. Here, once a maximum operating voltage is exceeded by a pre-determined amount, an ESD protection circuit is activated. In response, the ESD protection circuit reduces the voltage level applied to the application (often in the form of an application running on an integrated circuit (IC)) into an operating voltage lower than the 'trigger' voltage that caused the activation. The minimum voltage value that the protection device can reach after activation is termed the 'snapback' voltage.

In applications such as 'Power-Over-Ethernet (POE)', it is mandatory to avoid use of a 'strong snapback' ESD protection, in an attempt to increase the application's reliability. That is, if the snapback voltage falls below the maximum operating voltage, a direct current may be generated and input to the ESD protection circuit. In some instances, the direct current may destroy the ESD protection circuit. In other instances, the ESD protection circuit is not destroyed but remains triggered by the injected current from the running application applied to the protection structure (known as a latch-up phenomenon), which results in the application failure. Such protection mechanisms are typically used to prevent latch-up due to electro-magnetic discharge effects or as a result of parasitic fast transients.

Referring now to FIG. 1, a known current 110 versus voltage 105 relationship of a snapback protection structure is illustrated in graph 100. A conception window 125 is highlighted. The conception window 125 corresponds to the region, in which the protection on-state has to be included in order to guarantee a safe and efficient operation. Furthermore, as shown, the applied voltage has to be higher than the operating voltage 140, to ensure reliable operation of the device. In addition, the maximum voltage capability 150 of the circuit (for example due to oxide breakdown) should never be exceeded. Finally, in order to guarantee robustness of the device a current value 120 is defined, up to which the protection function should be guaranteed. By combining these constraints, a maximum acceptable value of the on-state resistance R-on 115 can be estimated.

When a specific application requires a narrow ESD trigger voltage to snapback voltage window 125 (for example if the supply voltage is close to the maximum voltage capabilities of the technology), the snapback voltage 145 and triggering voltage 150 are of the same order. In this case, the ESD protection should exhibit 'soft snapback' or 'no-snapback' behaviour.

ESD protection of power devices is mostly implemented using NPN transistors in a dual-polarity configuration, often in the form of an integrated circuit in an electronic device. During the electro-static discharge, a large part of the energy is dissipated through the vertical bipolar device.

Hence, the snapback voltage is determined by the vertical transistor features, which are driven by the technology. For a 'soft snapback' structure, the triggering voltage has to be close to the snapback voltage of the vertical bipolar. Thus, several structures need to be stacked upon each other to reach a suitably high snapback voltage $V_{SB}$ value 145. Such a structure is undesirable due to the resultant high dynamic resistance and the large area of silicon being required to implement the structure.

U.S. Pat. No. 6,707,110 B2 discloses a protection mechanism that uses two transistors that are active in the same device, one being a lateral device and the other being a vertical device. NPN and PNP transistors are listed with potentially high snapback voltages. For 'soft snapback' protection, it is well known that the PNP has higher intrinsic capabilities. However, the PNP described in U.S. Pat. No. 6,707,110 B2 would include a P-buried layer, which is hugely difficult to implement in practice and not applicable to many technologies.

U.S. Pat. No. 6,784,029 B describes a bi-directional ESD protection structure for BiCMOS technology. The structure disclosed comprises two 'P' implant regions separated by an 'N' region, which in combination defines a PNP structure. However, such a structure is unacceptable when using vertical MOSFET technology, as vertical conduction is impossible due to there being no buried layer. Furthermore, such a structure exhibits the behaviour of a thyristor, which would thereby provide a snapback voltage that is too low and causes latch-up.

Thus, a need exists for an improved semiconductor structure, particularly one that provides improved protection against parasitic effects such as electro-static discharge. Furthermore, and in particular, a need exists for a more robust soft snapback structure, for example with a triggering voltage above 40V, that provides low R-on ESD protection and has a minimum footprint.

SUMMARY OF THE INVENTION

In accordance with aspects of the present invention, there is provided a semiconductor device structure, an integrated circuit comprising the semiconductor structure and an electronic device comprising the integrated circuit, as defined in the appended Claims.

Figure 1:
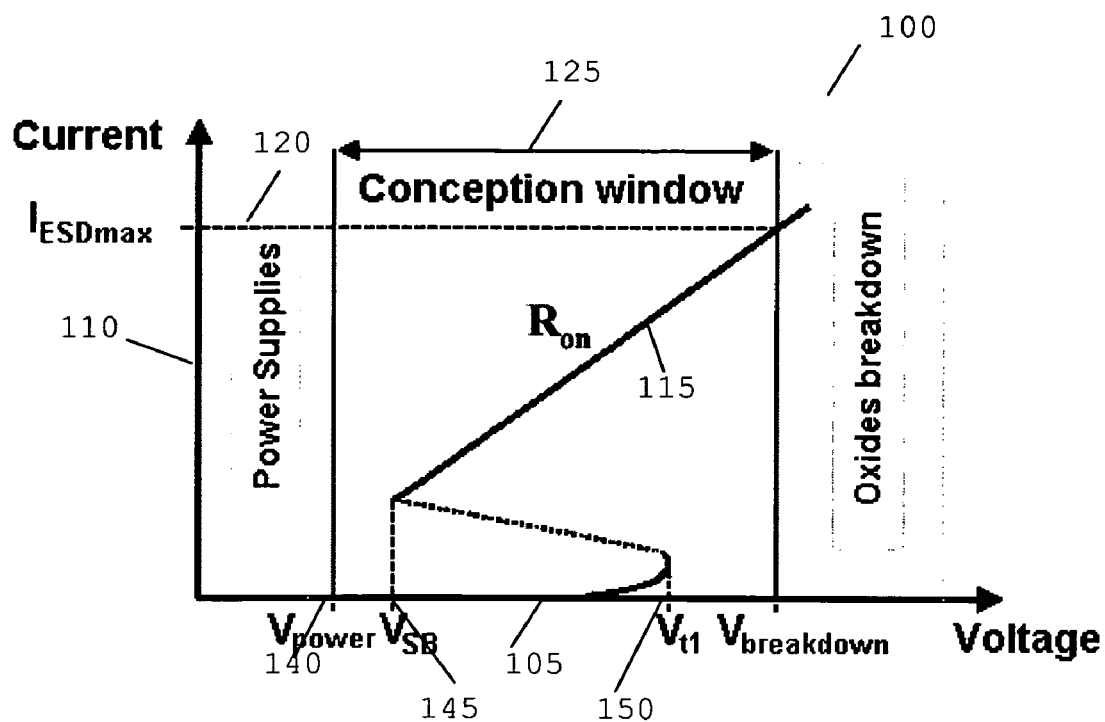
FIG. 1 illustrates a graph of a known current versus voltage relationship for a semiconductor structure highlighting the problems in implementing a snapback ESD structure.
Figure 2:
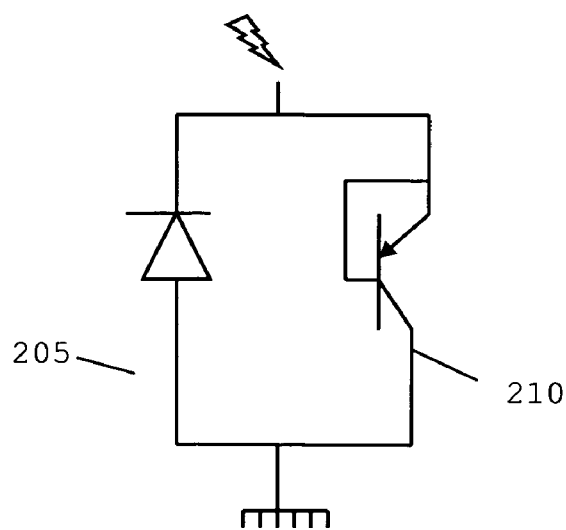
Figure 3:
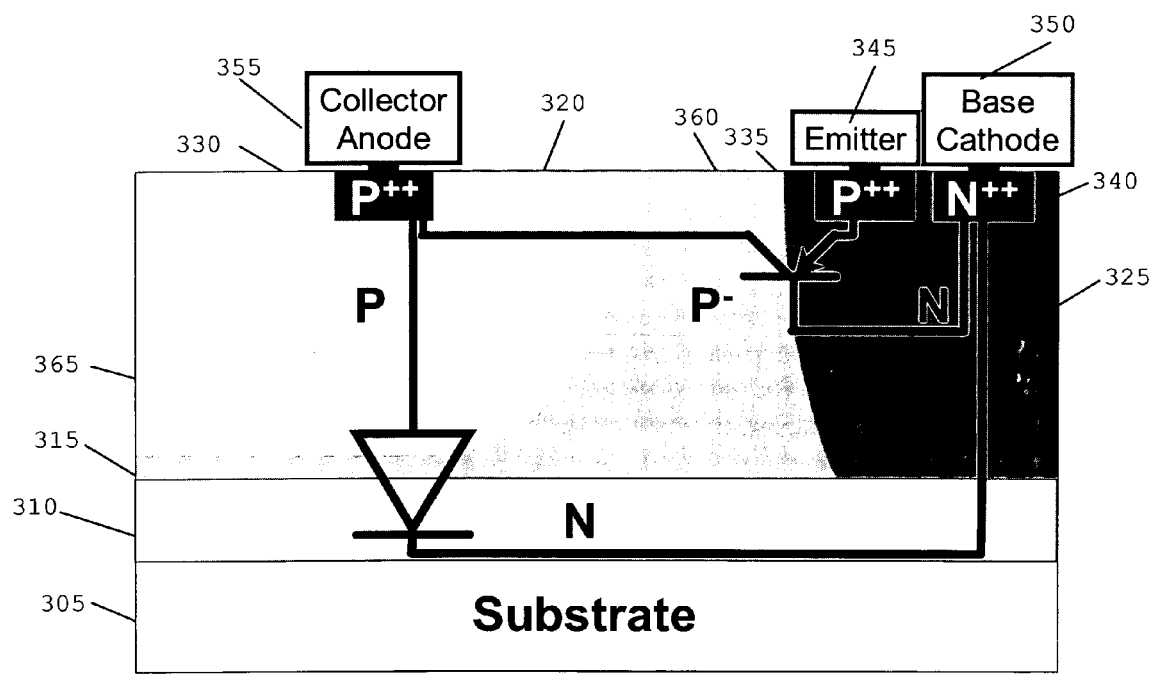
Figure 4:
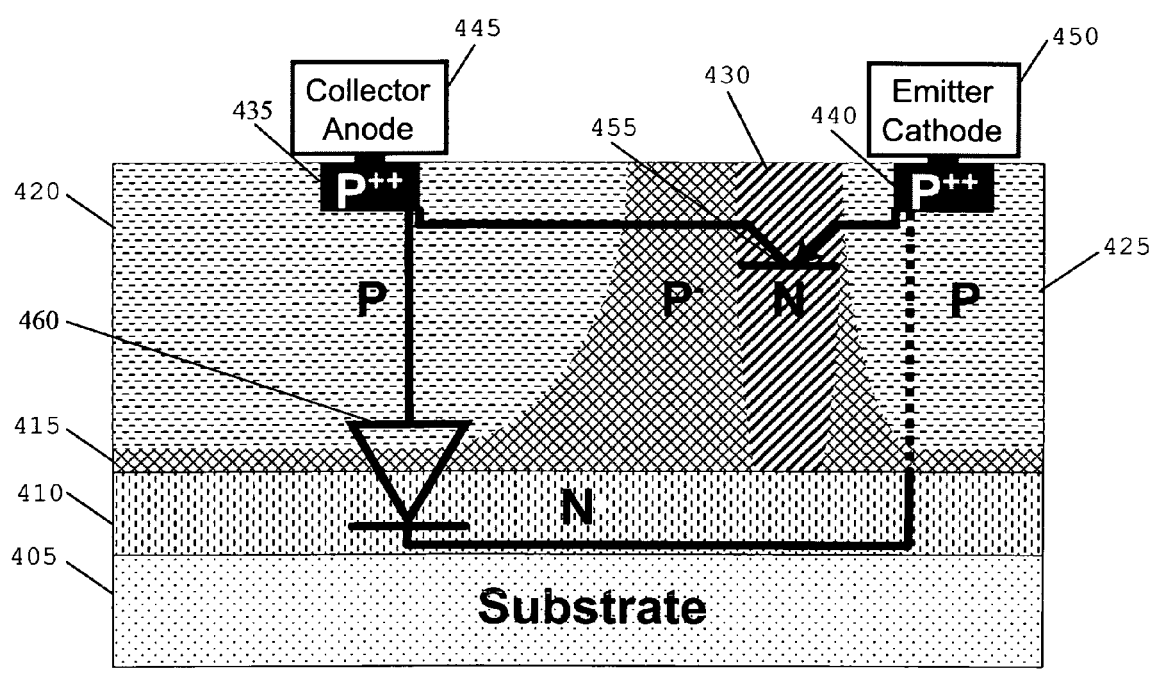

Exemplary embodiments of the present invention will now be described, by way of example only, with reference to the accompanying drawings, in which:

FIG. 2 illustrates an equivalent circuit of one embodiment of the present invention, utilising a vertical P/N diode and a PNP transistor in parallel;

FIG. 3 illustrates a semiconductor device structure in accordance with one embodiment of the present invention;

FIG. 4 illustrates a semiconductor device structure in accordance with one embodiment of the present invention; and FIG. 5 illustrates a graph of current versus voltage of the circuit in FIG. 2 when implemented using the structures of FIG. 3 and FIG. 4 in accordance with embodiments of the present invention.

DESCRIPTION OF EMBODIMENTS OF THE INVENTION

In one embodiment of the present invention, a semiconductor device structure is described, whereby the semiconductor device structure comprises a plurality of vertical layers and a plurality of conductive elements. The vertical layers and plurality of conductive elements are arranged to co-operate to function as at least two active devices in parallel within a single structure.

Advantageously, the provision of a structure having vertical layers and a plurality of conductive elements in the manner described enables at least two active devices, for example any combination of P/N diode and PNP transistor, to be implemented in parallel within a single structure.

In one embodiment of the present invention, a further semiconductor device structure, or in one embodiment the same semiconductor device structure mentioned above, is described having a plurality of horizontal conductive elements and a plurality of vertical layers having a plurality of vertical conductive elements. The semiconductor device structure is arranged to support at least two concurrent current flows such that a first current flow is across the plurality of vertical conductive elements and a second current flow is across the plurality of horizontal conductive elements.

Advantageously, the provision of a structure having plurality of horizontal and vertical conductive elements, in the manner described, enables the support at least two concurrent and distinct current flows within the semiconductor structure.

In one embodiment, the at least two concurrent and distinct current flows may be combined, within the same structure, thereby supporting the provision of a plurality of active devices. Advantageously, the combined total current flow provides a stable current flow for the plurality of active devices within the semiconductor device structure.

In one embodiment of the present invention, the semiconductor device structure is employed in a protection circuit to protect against parasitic effects, for example to protect an electronic device against such effects.

In one embodiment of the present invention, the semiconductor device structure is employed in a protection circuit arranged to protect against parasitic effects, such as electrostatic discharge (ESD) or electromagnetic interference (EMI), for example in an electronic device susceptible to such effects.

In one embodiment of the present invention, the semiconductor device structure is arranged such that the first active device and the second active device are arranged to provide a low snapback voltage. In this manner, the inventive concept may be utilised in applications that cannot support 'snapback' voltages.

In one embodiment of the present invention, an integrated circuit comprises the aforementioned semiconductor device structure.

In one embodiment of the present invention, an electronic device comprises the aforementioned integrated circuit.

One embodiment of the present invention will be described in terms of BiCMOS technology and focused on a semiconductor structure that avoids or reduces stress or parasitic effects applied, for example, in a power device application. However, it will be appreciated by a skilled artisan that the inventive concept herein described may be embodied in any type of power application, for example one that requires efficient protection that triggers above 10V and below 100V, with an operating voltage drop window below 15V. In particular, it is envisaged that all applications of power BiCmos technology can benefit from the inventive concept of the new protection structure as herein described.

In the present invention, in contrast to U.S. Pat. No. 6,707, 110 B2, the presence of an N-buried layer is an active part of the vertical P/N diode. At high voltages, only the lateral transistor is active, in addition to the diode being active at reverse bias, thereby resulting in a low R-on and subsequent improvement in device robustness.

Here, also in contrast to U.S. Pat. No. 6,784,029 B1, lateral current is provided purely within a PNP transistor. In U.S. Pat. No. 6,784,029 B1, the presence of N+ doped layers within the two P region leads to a silicon control rectifier (SCR) configuration. Hence, the case of PNP transistor is not treated.

A standard protection arrangement includes, within the same structure, a lateral transistor and a vertical transistor. However, it is very challenging to provide an arrangement where the current flows are concurrent. The purpose of this configuration is to differentiate the triggering and the ESD conduction paths. A precise adjustment of the lateral breakdown voltage can be performed by selecting appropriate base and collector doping regions and adjusting the distances between these two regions. In general, this lateral transistor is not robust.

Hence, improvement methods (such as base widening, emitter ballast) are used to enhance the conduction of the vertical transistor, which are more robust. At high current, this results in a single vertical current flow. Such a principle is used in U.S. Pat. No. 6,864,538 B2, to obtain a tunable triggering voltage. However, and problematically, the snapback voltage is constant, as it is determined by vertical doping profile.

According to one embodiment of the present invention, a BiCMOS semiconductor structure, for the fabrication of high voltage Electro-Static Discharge (ESD) protection, is described. The semiconductor structure may be formed in an integrated circuit suitable for use in any electronic device, for example one where protection from ESD or EOS effects is desirable. Such a structure facilitates embedding different components within a 3D configuration, thereby taking advantage of co-existing lateral and vertical devices within a single structure. The supported active devices can be, for example, in the form of a PN diode or PNP transistor. In particular, the devices may be arranged such that the PN diode 205 and PNP transistor 210 are arranged to co-operate in parallel, as shown in the ESD protection equivalent circuit 200 shown in FIG. 2. The structures described with reference to FIG. 3 and FIG. 4 may be used to form two or more PN diodes in parallel or two or more PNP transistors in parallel or any combination of parallel active devices thereof.

Referring now to FIG. 3, a semiconductor device structure is illustrated in accordance with one embodiment of the present invention. The semiconductor structure is built on a substrate 305. It comprises a 'P' doped region 320 and an 'N' doped region 325, located within a 'P−' doped region 315. An N-type buried layer 310 is located under these three regions 315, 320, 325. A first 'P+' doped region 330 is implanted in the 'P' doped region 320. A second 'P+' doped region 335 and an 'N+' doped region 340 are implanted in the 'N' doped region.

The semiconductor device structure of FIG. 3 drives a lateral PNP transistor 360 and a vertical avalanche diode 365 coupled in parallel. The PNP transistor 360 is composed of the second 'P+' doped region 335 as an emitter, the 'N' doped region 325 as a base, and both the 'P−' doped region 315 and the 'P' doped region 320 as a collector. The emitter 345, base 350 and collector 355 contacts are respectively placed on the second 'P+' doped region 335, together with the 'N+' doped region 340 and the first 'P+' doped region 330.

In an ESD protection application, the lateral PNP transistor is used in a self-biased configuration (e.g. with the base linked to the emitter, either via a short-circuit or by a resistance). The transistor triggering is due to the base/collector avalanche-mode breakdown, set by the distance between the 'N' doped region 325 and the 'P' doped region 325.

The avalanche diode 365 is composed of both the 'P−' doped region 315 and the 'P' doped region 320 as the anode 355, and both the N-type buried layer 310 and 'N' doped region 325 as a cathode 350. The anode 355 and cathode 350 contacts are respectively placed on the first 'P+' doped region 330 and the 'N+' doped region 340. The diode breakdown is located at the junction of the 'P−' doped region 315 and the N-type buried layer 310. The diode breakdown is set by the anode implantations and 'N+' doped region characteristics.

A first advantage of this structure is concurrent functional operations may be obtained by adjusting the transistor triggering and the diode breakdown, using appropriate doping levels available within the technology process flow and setting anode/cathode, i.e. base/emitter spacing, accordingly.

In addition, a second advantage results from the coupling of the two components. In this regard, the diode current contributes to the total current required for a self biased transistor operation.

Referring now to FIG. 4, a semiconductor device structure 400 is illustrated, in accordance with one embodiment of the present invention. The semiconductor device structure 400 is built on a substrate 405 and comprises two 'P' doped regions 420 and 425 and an 'N' doped region 430 implanted in a 'P−' doped region 415. An N-type buried layer 410 is located under these three doped regions 415, 420, 425. Two 'P+' doped regions 435 and 440 are implanted respectively in each of the 'P' doped regions 420 and 425. This structure includes a lateral PNP transistor 455 and a vertical avalanche diode 460, coupled in parallel. The PNP transistor 455 is composed of one of the 'P' doped regions 425 as an emitter, the N-doped region 430 as a base, and both of the other 'P' doped regions as a collector.

The emitter contacts 445 and collector contacts 450 are respectively located on each of the 'P+' doped regions 440 and 435. There is no base contact. Thus, in this configuration, the bias current is provided by the impact ionisation at the Base/Collector junction. In this embodiment, the triggering voltage is also set by the distance between the base 'N' doped region 430 and the collector 'P' doped region 420.

The avalanche diode 460 is related to a PNP transistor with a low emitter injection. It is composed of both the 'P−' doped region 415 and the 'P' doped region 420 as the anode; the other 'P' doped region 425 and the N-type buried layer 410 forming the cathode. The 'P' doped region 425 in the cathode facilitates biasing of the N-type buried layer 410, and thus does not contribute to the transistor effect. The anode and cathode contacts are respectively placed on each of the 'P+' doped regions 445 and 450. The diode breakdown is located at the junction of the 'P−' doped region 415 and the N-type buried layer 410, and is set by the anode and 'N+' doped region 410 doping profiles.

In accordance with a second embodiment, the aforementioned semiconductor device structure 400 exhibits an improved coupling of the diode and the transistor. In this case all the diode current contributes to the transistor bias current, which is not the case in the first embodiment in which the diode current collected at the transistor base does not contribute efficiently to the transistor bias.

The following operation results when the PN diode of FIG. 4 and the PNP transistor of FIG. 3 are implemented in parallel, as illustrated in FIG. 2. As a result of the on-resistance exhibited during an ESD event applied to the respective single devices (characteristic of an avalanche diode), the voltage will continue to increase significantly after the first device has turned-on, i.e. surpassing the first breakdown voltage $Bv_1$. When the increasing voltage reaches the breakdown voltage $Bv_2$ of the second device, the second device will trigger.

Thus, and advantageously, the resulting I-V curve when the PN diode and the PNP transistor are used in parallel will exhibit the typical low snapback behaviour of a PNP transistor with two inflexions corresponding to the two diode breakdown points and a resulting low on-resistance directly to the two concurrent electrical paths, as illustrated in FIG. 5.

Moreover, as a result of the two co-existing vertical and lateral current paths, the new structure illustrated in FIG. 3 and FIG. 4 exhibits outstanding ESD robustness within a minimum footprint, due to the two parallel devices being manufactured within the same semi-conductor device structure 400. In this regard, it has been found that with appropriate layout of the devices, it is possible to achieve high triggering voltages, with low on-resistance and low snapback. Furthermore, a five-fold surface occupancy reduction has been achieved with respect to current solutions using the same technology. For instance, using a 100×100 μm structure, an on-state resistance of 5 ohm can be obtained. Hence providing an equivalent density of 0.5 milli-ohm·cm$^2$.

It will be understood that the improved semiconductor structure, as described above, aims to provide at least one or more of the following advantages:
  (i) Higher performance for a given size of device, for example higher current density and lower on-resistance.
  (ii) Supports high triggering voltages with low on-resistance and reduced snapback performance, particularly applicable for automotive applications; when power supply and oxide breakdown windows are narrow (~10V).
  (iii) Reduced die area size, thereby reduced lower cost, whilst maintaining good ESD performance.

(iv) It is possible to embed different components in a 3D structure, thereby taking advantage of coexisting lateral and vertical devices within a single structure.

(v) Due to the low snapback characteristic, it improves Electromagnetic and parasitic integrity (EMI).

It will be appreciated that any suitable distribution of functionality between horizontal and/or vertical layers may be used without detracting from the inventive concept herein described. Hence, references to specific sizes or configuration of layers in the figures are only to be seen as references to suitable means for providing the described functionality, rather than indicative of a strict logical or physical structure or organization.

In particular, it is envisaged that the aforementioned inventive concept can be applied by a semiconductor manufacturer to any integrated circuit, for example those of the Freescale™ BiCMOS technology. It is further envisaged that, for example, a semiconductor manufacturer may employ the inventive concept in a design of a standalone device or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate. In addition, singular references do not exclude a plurality. Thus, references to "a", "an", "first", "second" etc. do not preclude a plurality.

Thus, an improved semiconductor structure has been described, wherein the aforementioned disadvantages with prior art arrangements have been substantially alleviated.

The invention claimed is:

1. A semiconductor device structure comprising:
a plurality of horizontal conductive elements and a plurality of vertical layers having a plurality of vertical conductive elements wherein the semiconductor device structure supports at least two active devices in parallel within the same structure;
a first active device being a PN diode and is arranged to support at least two concurrent current flows such that a first current flow is across the plurality of vertical conductive elements and a second current flow is across the plurality of horizontal conductive elements;
wherein:
the plurality of horizontal conductive elements form a PNP transistor as a second active device comprising a 'P' doped region and an 'N' doped region located within a 'P$^-$' doped region; and
a terminal of the PN diode and an emitter of the PNP transistor are connected at a first node, and another terminal of the PN diode and a collector of the PNP transistor are connected at a second node.

2. The semiconductor device structure of claim 1 wherein the total current flow within the semiconductor device structure is a combination of at least the first current flow and the second current flow.

3. The semiconductor device structure of claim 2 wherein a combined total current flow within the semiconductor device structure provides a stable current flow for the semiconductor device.

4. The semiconductor device structure of claim 1 wherein the semiconductor structure is employed in a protection circuit to protect against parasitic effects.

5. The semiconductor device structure of claim 4 wherein the protection circuit is arranged to protect against electrostatic discharge or electromagnetic interference.

6. The semiconductor device structure of claim 1 wherein an N-type buried layer is located under the three doped regions.

7. The semiconductor device structure of claim 1 wherein a first 'P$^+$' doped region is implanted in the 'P' doped region and a second 'P$^+$' doped region and an 'N$^+$' doped region are implanted in the 'N' doped region.

8. The semiconductor device structure of claim 1 wherein two 'P$^+$' doped regions are implanted respectively in a first 'P' doped region and a second 'P' doped region.

9. The semiconductor device structure of claim 8 wherein a PNP transistor is composed of the second 'P$^+$' doped region as an emitter, the 'N' doped region as a base, and both the 'P$^-$' doped region and the 'P' doped region as a collector.

10. The semiconductor device structure of claim 8 wherein emitter, base and collector contacts are respectively placed on the second 'P$^+$' doped region, the 'N$^+$' doped region and the first 'P$^+$' doped region.

11. The semiconductor device structure of claim 8 wherein PN diode current is arranged to contribute to the transistor bias current.

12. The semiconductor device structure of claim 8 wherein a PNP transistor is composed of one of the 'P' doped regions as an emitter, the N-doped region as a base, and both the first 'P' doped region and second 'P' doped region as a collector.

13. The semiconductor device structure of claim 8 wherein a first voltage is arranged to increase after the first active device has surpassed a first threshold voltage and trigger the second active device when the increasing voltage reaches a second threshold voltage.

14. The semiconductor device structure of claim 8 wherein the first active device and the second active device are arranged to provide a low snapback voltage.

15. An integrated circuit comprising a semiconductor device structure according to claim 8.

16. An electronic device comprising the integrated circuit according to claim 15.

17. A semiconductor device comprising:
a plurality of horizontal conductive elements and a plurality of vertical layers having a plurality of vertical conductive elements wherein the semiconductor device structure supports at least two active devices in parallel within the same structure;
a first active device being a PN diode and is arranged to support at least two concurrent current flows such that a first current flow is across the plurality of vertical conductive elements and a second current flow is across the plurality of horizontal conductive elements;
wherein:
the plurality of horizontal conductive elements form a PNP transistor as a second active device comprising a 'P' doped region and an 'N' doped region located within a 'P$^-$' doped region; and a base of the PNP transistor and an emitter of the PNP transistor are connected at a node.

18. The semiconductor device structure of claim 2 wherein a first 'P+' doped region is implanted in the 'P' doped region and a second 'P+' doped region and an 'N+' doped region are implanted in the 'N' doped region.

19. The semiconductor device structure of claim 9 wherein a first voltage is arranged to increase after the first active device has surpassed a first threshold voltage and trigger the second active device when the increasing voltage reaches a second threshold voltage.

20. The semiconductor device structure of claim 17 wherein the semiconductor structure is employed in a protection circuit to protect against parasitic effects.

* * * * *